United States Patent
Asrani (10) Patent No.: US 11,056,800 B2
(45) Date of Patent: Jul. 6, 2021

(54) ANTENNA ARRAYS INTEGRATED INTO AN ELECTROMAGNETIC TRANSPARENT METALLIC SURFACE

(71) Applicant: Google LLC, Mountain View, CA (US)

(72) Inventor: Vijay L. Asrani, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/161,906

(22) Filed: Oct. 16, 2018

(65) Prior Publication Data
US 2020/0119454 A1 Apr. 16, 2020

(51) Int. Cl.
| H04B 1/38 | (2015.01) |
| H01Q 21/06 | (2006.01) |
| H01Q 1/24 | (2006.01) |
| H01Q 21/00 | (2006.01) |
| H04M 1/02 | (2006.01) |

(52) U.S. Cl.
CPC ........... *H01Q 21/065* (2013.01); *H01Q 1/243* (2013.01); *H01Q 21/0087* (2013.01); *H04M 1/026* (2013.01)

(58) Field of Classification Search
CPC .. H01Q 21/065; H01Q 1/243; H01Q 21/0087; H01Q 9/0435; H01Q 9/0407; H01Q 21/24; H01Q 1/38; H01Q 1/2283; H04M 1/026; H01L 2223/6677; H01L 23/66
USPC .......................................................... 455/73
See application file for complete search history.

(56) References Cited

U.S. PATENT DOCUMENTS

| 8,971,437 B2 * | 3/2015 | Brown ................. H04B 7/0469 |
| | | 375/267 |
| 9,059,505 B1 * | 6/2015 | Asrani ................... H01Q 9/145 |
| 9,502,752 B2 | 11/2016 | Darnell et al. |
| 9,629,267 B2 * | 4/2017 | Asrani ................... B32B 15/08 |
| 9,766,666 B1 * | 9/2017 | Asrani ................. G06F 1/1698 |
| 9,972,892 B2 | 5/2018 | Noori et al. |

(Continued)

FOREIGN PATENT DOCUMENTS

| CN | 204011744 U | * 12/2014 | |
| CN | 209232953 U | * 8/2019 | |
| EP | 2390955 A1 | * 11/2011 | ............... H01Q 1/38 |

OTHER PUBLICATIONS

"International Search Report and Written Opinion", PCT Application No. PCT/US2019/054769, dated Dec. 5, 2019, 14 pages.

(Continued)

*Primary Examiner* — Mahendra R Patel
(74) *Attorney, Agent, or Firm* — Colby Nipper PLLC (57) ABSTRACT

The present disclosure describes one or more aspects of surface-cell patch antenna arrays integrated as part of a user equipment housing. As part of integration, surface-cell patch antennas are formed from surface-cells that comprise an electromagnetic-transparent metallic surface proximate an outer surface of the housing. The surface-cell patch antennas, in turn, form a surface-cell patch antenna array. A transceiver module, disposed proximate an inner surface of the user equipment housing, includes a transceiver device and a flexible printed circuit board having traces that electrically couple the transceiver device to the surface-cell patch antenna array. The described aspects alleviate manufacturing and design challenges that are associated with use of patch array modules.

21 Claims, 10 Drawing Sheets

(56) References Cited

U.S. PATENT DOCUMENTS

| | | | | |
|---|---|---|---|---|
| 10,297,923 B2* | 5/2019 | Chen | | H01Q 23/00 |
| 10,732,340 B2* | 8/2020 | Schubert | | G02B 6/0008 |
| 2001/0055948 A1* | 12/2001 | Ikeda | | H01Q 1/38 |
| | | | | 455/13.3 |
| 2003/0122715 A1* | 7/2003 | Aikawa | | H01Q 9/0457 |
| | | | | 343/700 MS |
| 2004/0233106 A1* | 11/2004 | Rao | | H01Q 9/42 |
| | | | | 343/700 MS |
| 2007/0035450 A1* | 2/2007 | Chang | | H01Q 1/007 |
| | | | | 343/700 MS |
| 2010/0253587 A1* | 10/2010 | Lindenmeier | | H01Q 7/00 |
| | | | | 343/797 |
| 2012/0190310 A1* | 7/2012 | Ieki | | H01Q 25/001 |
| | | | | 455/73 |
| 2012/0212375 A1* | 8/2012 | Depree, IV | | H01Q 15/0086 |
| | | | | 343/700 MS |
| 2013/0257672 A1* | 10/2013 | Lu | | H01Q 1/525 |
| | | | | 343/843 |
| 2015/0123869 A1* | 5/2015 | Bit-Babik | | H01Q 19/10 |
| | | | | 343/857 |
| 2015/0234035 A1* | 8/2015 | Lohoefener | | G01S 13/953 |
| | | | | 343/702 |
| 2016/0149315 A1* | 5/2016 | Elsherbini | | H01Q 1/245 |
| | | | | 455/101 |
| 2016/0172755 A1* | 6/2016 | Chen | | H01Q 23/00 |
| | | | | 342/371 |
| 2016/0211580 A1* | 7/2016 | Hsu | | H01Q 9/045 |
| 2016/0276734 A1* | 9/2016 | Jin | | H01Q 21/28 |
| 2016/0365638 A1* | 12/2016 | Luk | | H01Q 9/285 |
| 2017/0062952 A1* | 3/2017 | Sundararajan | | H01Q 1/523 |
| 2017/0110787 A1* | 4/2017 | Ouyang | | H01Q 1/40 |
| 2017/0222666 A1* | 8/2017 | Hyun | | H01Q 21/205 |
| 2018/0062263 A1* | 3/2018 | Ueda | | H01Q 21/06 |
| 2018/0159203 A1* | 6/2018 | Baks | | H01Q 9/0407 |
| 2018/0205134 A1* | 7/2018 | Khan | | H01Q 1/2283 |
| 2018/0219587 A1* | 8/2018 | Huo | | H04B 1/40 |
| 2018/0358991 A1* | 12/2018 | Kwok | | H01Q 1/02 |
| 2019/0020714 A1* | 1/2019 | Lee | | H01Q 1/50 |
| 2019/0104212 A1* | 4/2019 | Lee | | H01Q 9/0435 |
| 2019/0165486 A1* | 5/2019 | Yoshida | | H01Q 21/06 |
| 2019/0229402 A1* | 7/2019 | Xia | | H01Q 21/065 |
| 2019/0252757 A1* | 8/2019 | Baek | | H01Q 1/02 |
| 2019/0281146 A1* | 9/2019 | Jang | | H01Q 9/0407 |
| 2019/0319341 A1* | 10/2019 | Park | | H01Q 21/062 |
| 2019/0319364 A1* | 10/2019 | Yang | | H01Q 1/2283 |
| 2019/0379119 A1* | 12/2019 | He | | H01Q 21/08 |
| 2020/0021010 A1* | 1/2020 | Ou | | H01Q 1/243 |
| 2020/0028949 A1* | 1/2020 | Kim | | H01Q 5/30 |
| 2020/0036083 A1* | 1/2020 | Kim | | H01Q 1/243 |
| 2020/0106473 A1* | 4/2020 | Rong | | H04L 25/02 |
| 2020/0358181 A1* | 11/2020 | Hua | | H01Q 3/40 |

OTHER PUBLICATIONS

"Written Opinion", PCT Application No. PCT/US2019/054769, dated Sep. 11, 2020, 7 pages.

"International Preliminary Report on Patentability", Application No. PCT/US2019/054769, dated Apr. 14, 2021, 8 pages.

* cited by examiner

```
┌─────────────────────────────────────────────┐
│ Remove, from a first side of a member       │
│ comprised of a metal material, first        │
│ portions of the metal material to form      │
│ signal feed posts that extend from the      │
│ member                                      │
│ 602                                         │
└─────────────────────────────────────────────┘
                      ↓
┌─────────────────────────────────────────────┐
│ Remove, from the first side of the member   │
│ comprised of the metal, second portions of  │
│ the metal material to form an outline of a  │
│ surface-cell patch antenna                  │
│ 604                                         │
└─────────────────────────────────────────────┘
                      ↓
┌─────────────────────────────────────────────┐
│ Provision, to the first side of the member, │
│ a dielectric material, the dielectric       │
│ material covering the signal feed posts and │
│ the outline of the surface-cell patch       │
│ antenna                                     │
│ 606                                         │
└─────────────────────────────────────────────┘
                      ↓
┌─────────────────────────────────────────────┐
│ Remove, from a second side of the member    │
│ that is opposite the first side, third      │
│ portions of the metal material to expose a  │
│ surface of the surface-cell patch antenna   │
│ 608                                         │
└─────────────────────────────────────────────┘
                      ↓
┌─────────────────────────────────────────────┐
│ Remove, from the first side of the member,  │
│ portions of the dielectric material to      │
│ expose surfaces of the signal feed posts    │
│ 610                                         │
└─────────────────────────────────────────────┘
```

```
┌─────────────────────────────────────────────┐
│ Receive a signal via a surface-cell patch   │
│ antenna of a surface-cell patch antenna     │
│ array that is proximate an outer surface    │
│ of a housing of a user equipment            │
│                    802                       │
└─────────────────────────────────────────────┘
                     │
                     ▼
┌─────────────────────────────────────────────┐
│ Propagate the signal to a transceiver       │
│ device via a trace of a flexible PCB that   │
│ is disposed proximate an inner surface of   │
│ the housing                                 │
│                    804                       │
└─────────────────────────────────────────────┘
                     │
                     ▼
┌─────────────────────────────────────────────┐
│         Propagate the signal to a modem     │
│                    806                       │
└─────────────────────────────────────────────┘
                     │
                     ▼
┌─────────────────────────────────────────────┐
│              Demodulate the signal          │
│                    808                       │
└─────────────────────────────────────────────┘
                     │
                     ▼
┌─────────────────────────────────────────────┐
│  Perform an operation based on the          │
│  demodulated signal                         │
│                    810                       │
└─────────────────────────────────────────────┘
```

Fig. 8

ANTENNA ARRAYS INTEGRATED INTO AN ELECTROMAGNETIC TRANSPARENT METALLIC SURFACE

BACKGROUND

A user equipment, such as a smartphone, generally includes one or more antenna arrays. While the user equipment is communicating wirelessly, each antenna array may transmit or receive signals in the form of electromagnetic waves. For extremely-high frequency (EHF) wireless communications, such as fifth-generation new radio (5G NR) wireless communications that transmit and receive signals at frequencies ranging from 30 gigahertz (GHz) to 300 GHz, the wavelengths of these signals can range from 10 mm in length down to 1 mm in length. Such signals are referred to as signals that have mm-waves.

A common type of an antenna array used in a user equipment today for ultra-high frequency (UHF) wireless communications, such as third-generation partnership project long-term evolution (3GPP LTE) wireless communications that transmit signals at frequencies ranging from 700 megahertz (MHz) to 3000 MHz, is a patch array module. Implementing the patch array module into the user equipment introduces performance and design issues to the user equipment. As an example, construction of the patch array module may limit the use of materials such as metal, gorilla glass, or ceramics due to high signal-penetration losses. As another example, space limitations may require that a transceiver of the user equipment is located remotely from the patch array module. Separating the transceiver from the patch array module in such a fashion can lead to losses in signal fidelity or amplitude for a signal propagating between the transceiver and the patch array module. Signal interference scenarios may also require a design that incorporates multiple patch array modules at multiple positions throughout the user equipment. For example, a user equipment can mitigate signal blockage resulting from a hand, body, walls, foliage, or other obstruction by switching amongst multiple patch array modules, beamforming using one or more of the multiple patch array modules, or a combination thereof. However, and in addition to exacerbating the aforementioned design challenges, the use of multiple patch array modules increases manufacturing costs and consumes valuable space of the user equipment.

In general, the aforementioned performance and design issues render patch array modules undesirable for antennas that may transmit and receives mm-wave signals. For 5G NR wireless communications, improvements in antenna technologies are needed.

SUMMARY

The present disclosure describes one or more aspects of surface-cell patch antenna arrays integrated into an electromagnetic-transparent metallic (ETM) surface of a user equipment. Such a surface may include decorative features in a housing of the user equipment.

In some aspects, a user equipment is described. The user equipment includes a housing having an outer surface and an inner surface, where the inner surface is opposite the outer surface. A surface-cell patch antenna array is formed into the housing proximate the outer surface of the housing, the surface-cell patch antenna array defining a first generally planar region proximate the outer surface of the housing. The user equipment includes a transceiver module disposed in a second generally planar region that is parallel to, and corresponds with, the first generally planar region and is located proximate the inner surface of the housing. The transceiver module comprises a transceiver device and a flexible printed circuit board having traces that electrically couple the transceiver device to signal feed posts of the surface-cell patch antenna array. The user equipment further includes a connector that electrically couples the transceiver module to a modem contained on a logic board of the user equipment.

In other aspects, a structure is described. The structure comprises a surface-cell patch antenna that is formed at an outer surface of a housing that has a substrate formed from a dielectric material. The structure includes a vertical-polarization signal feed post that is electrically coupled to the surface-cell patch antenna and passes through the dielectric material to an inner surface of the housing, where the inner surface of the housing is opposite the outer surface of the housing and is parallel to the outer surface of the housing. The structure further includes a horizontal-polarization signal feed post that is electrically coupled to the surface-cell patch antenna and passes through the dielectric material to the inner surface of the housing. A transceiver module, including a transceiver device and a flexible printed circuit board, is disposed proximate an inner surface of the housing. The flexible printed circuit board includes a trace that electrically couples the vertical-polarization signal feed post to a vertical-polarization signal output of the transceiver device and another trace that electrically couples the horizontal-polarization signal feed post a horizontal-polarization signal output of the transceiver device.

In other aspects, a method performed by a user equipment is described. The method comprises receiving a signal via a surface-cell patch antenna of a surface-cell patch antenna array that is proximate an outer surface of a housing of the user equipment. The method includes propagating the signal to a transceiver device via a trace of a flexible printed circuit board (PCB) that is disposed proximate an inner surface of the housing that is opposite the outer surface and parallel to the outer surface. The signal is then propagated to a modem that is part of the user equipment via a connector that electrically couples the flexible PCB to the modem and demodulated by the modem. The method then continues, where the user equipment performs an operation based on the demodulated signal.

The details of one or more implementations are set forth in the accompanying drawings and the following description. Other features and advantages will be apparent from the description and drawings, and from the claims. This summary is provided to introduce subject matter that is further described in the Detailed Description and Drawings. Accordingly, a reader should not consider the summary to describe essential features nor limit the scope of the claimed subject matter.

BRIEF DESCRIPTION OF THE DRAWINGS

This document describes details of one or more aspects of surface-cell patch antenna arrays integrated into an electromagnetic-transparent metallic surface that is used as part of a user equipment housing. The use of the same reference numbers in different instances in the description and the figures may indicate like elements.

DETAILED DESCRIPTION

The present disclosure describes one or more aspects of surface-cell patch antenna arrays integrated into an electromagnetic-transparent metallic surface that is used as part of a user equipment housing. As part of integration, surface-cell patch antennas are formed from surface-cells that comprise an electromagnetic-transparent metallic surface proximate an outer surface of the housing. The surface-cell patch antennas, in turn, form a surface-cell patch antenna array. A transceiver module, disposed proximate an inner surface of the user equipment housing, includes a transceiver device and a flexible printed circuit board having traces that electrically couple the transceiver device to the surface-cell patch antenna array. The described aspects alleviate manufacturing and design challenges that are associated with use of patch array modules.

While features and concepts of the described systems and methods for such antenna arrays can be implemented in any number of different environments, systems, devices, and/or various configurations, aspects are described in the context of the following example devices, systems, and configurations.

Operating Environment

Figure 1:
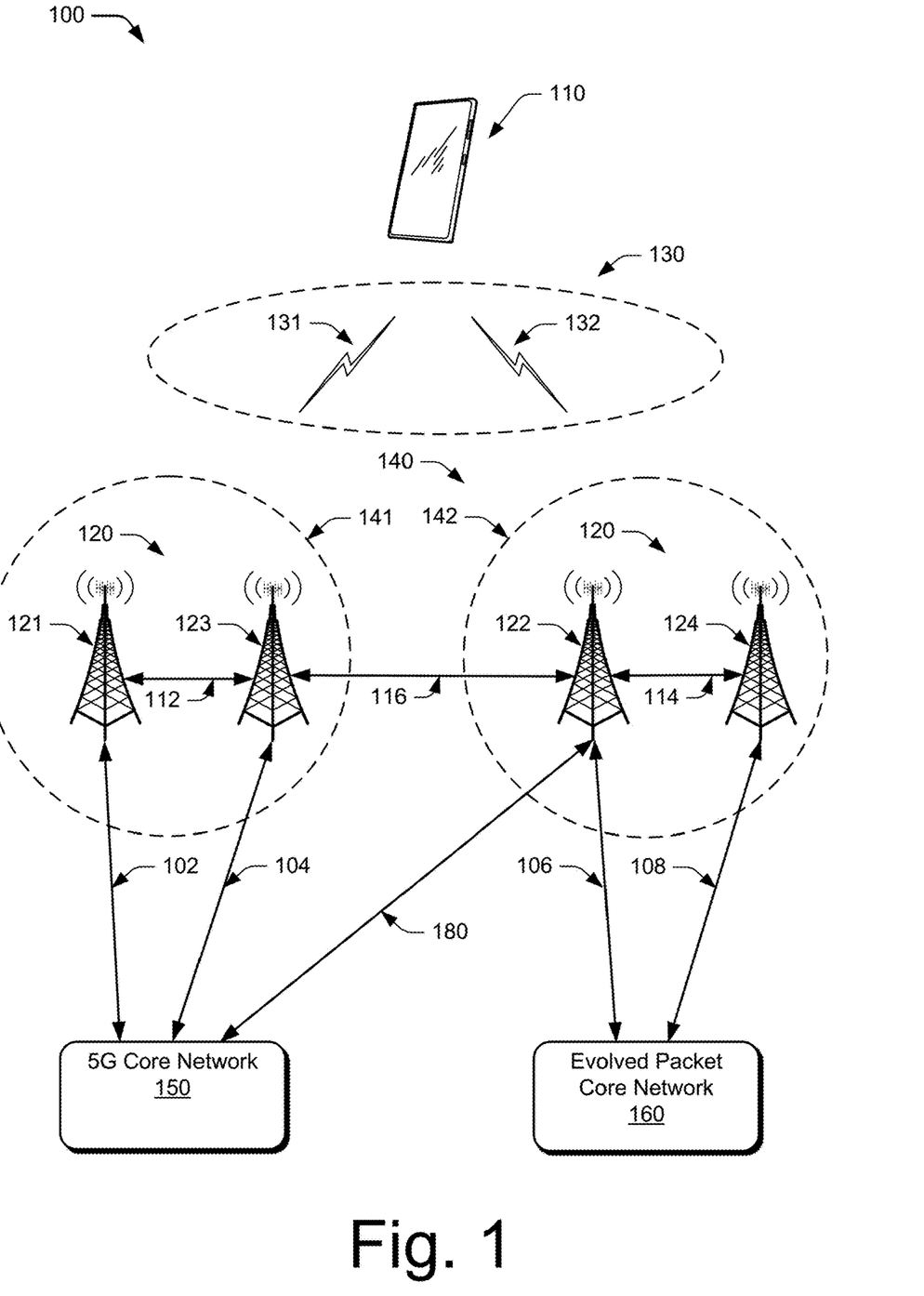
FIG. 1 illustrates an example operating environment in which various aspects of surface-cell patch antenna arrays integrated into an electromagnetic-transparent metallic surface can be implemented.

FIG. 1 illustrates an example operating environment 100 in which various aspects of surface-cell patch antenna arrays integrated into an electromagnetic-transparent metallic surface can be implemented. In the operating environment 100, a UE 110 communicates with one or more base stations 120 (illustrated as base stations 121, 122, 123, and 124) through one or more wireless communication links 130 (wireless link 130), illustrated as wireless links 131 and 132. In this example, the UE 110 is implemented as a smartphone. Although illustrated as a smartphone, the UE 110 may be implemented as any suitable computing or electronic device, such as a mobile communication device, a modem, cellular phone, gaming device, navigation device, media device, laptop computer, desktop computer, tablet computer, smart appliance, vehicle-based communication system, or the like or the like that implements an ETM surface as described herein. The base stations 120 (e.g., an Evolved Universal Terrestrial Radio Access Network Node B, E-UTRAN Node B, evolved Node B, eNodeB, eNB, Next Generation Node B, gNode B, gNB, or the like) may be implemented in a macrocell, microcell, small cell, picocell, or the like, or any combination thereof.

The base stations 120 communicate with the UE 110 via the wireless links 131 and 132, which may be implemented as any suitable type of wireless link. The wireless link 131 and 132 can include a downlink of data and control information communicated from the base stations 120 to the UE 110, an uplink of other data and control information communicated from the UE 110 to the base station 120s, or both. The wireless links 130 may include one or more wireless links or bearers implemented using any suitable communication protocol or standard, or combination of communication protocols or standards such as third-generation partnership project long-term evolution (3GPP LTE), fifth-generation new radio (5G NR), and so forth. Multiple wireless links 130 may be aggregated in a carrier aggregation to provide a higher data rate for the UE 110. Multiple wireless links 130 from multiple base stations 120 may be configured for Coordinated Multipoint (CoMP) communication with the UE 110.

The base stations 120 are collectively a radio access network 140 (RAN, Evolved Universal Terrestrial Radio Access Network, E-UTRAN, 5G NR RAN or NR RAN). The RANs 140 are illustrated as a NR RAN 141 and an E-UTRAN 142. The base stations 121 and 123 in the NR RAN 141 are connected to a fifth-generation core 150 (5GC 150) network. The base stations 122 and 124 in the E-UTRAN 142 are connected to an evolved packet core 160 (EPC 160). Optionally or additionally, the base station 122 may connect to both the 5GC 150 and EPC 160 networks.

The base stations 121 and 123 connect, at 102 and 104 respectively, to the 5GC 150 via an NG2 interface for control-plane signaling and via an NG3 interface for user-plane data communications. The base stations 122 and 124 connect, at 106 and 108 respectively, to the EPC 160 via an Si interface for control-plane signaling and user-plane data communications. Optionally or additionally, if the base station 122 connects to the 5GC 150 and EPC 160 networks, the base station 122 connects to the 5GC 150 via an NG2 interface for control-plane signaling and via an NG3 interface for user-plane data communications, at 180.

In addition to connections to core networks, base stations 120 may communicate with each other. The base stations 121 and 123 communicate via an Xn interface at 112. The base stations 122 and 124 communicate via an X2 interface at 114.

Furthermore, within the environment 100, the UE 110 may wirelessly communicate with the base stations 120 via the wireless communication links 130, during which electromagnetic waves, or signals, are transmitted or received by one or more antenna arrays that are part of the UE 110. In an instance where the UE 110 is communicating with transmission of a signal by the UE 110, in certain instances, the UE 110 may employ one or more surface-cell antennas of a surface-cell patch antenna array to perform a beamforming operation. Such a beamforming operation may, via principles of constructive and destructive interference, form a directional path of the signal or an amplitude of the signal.

Example Devices

Figure 2:
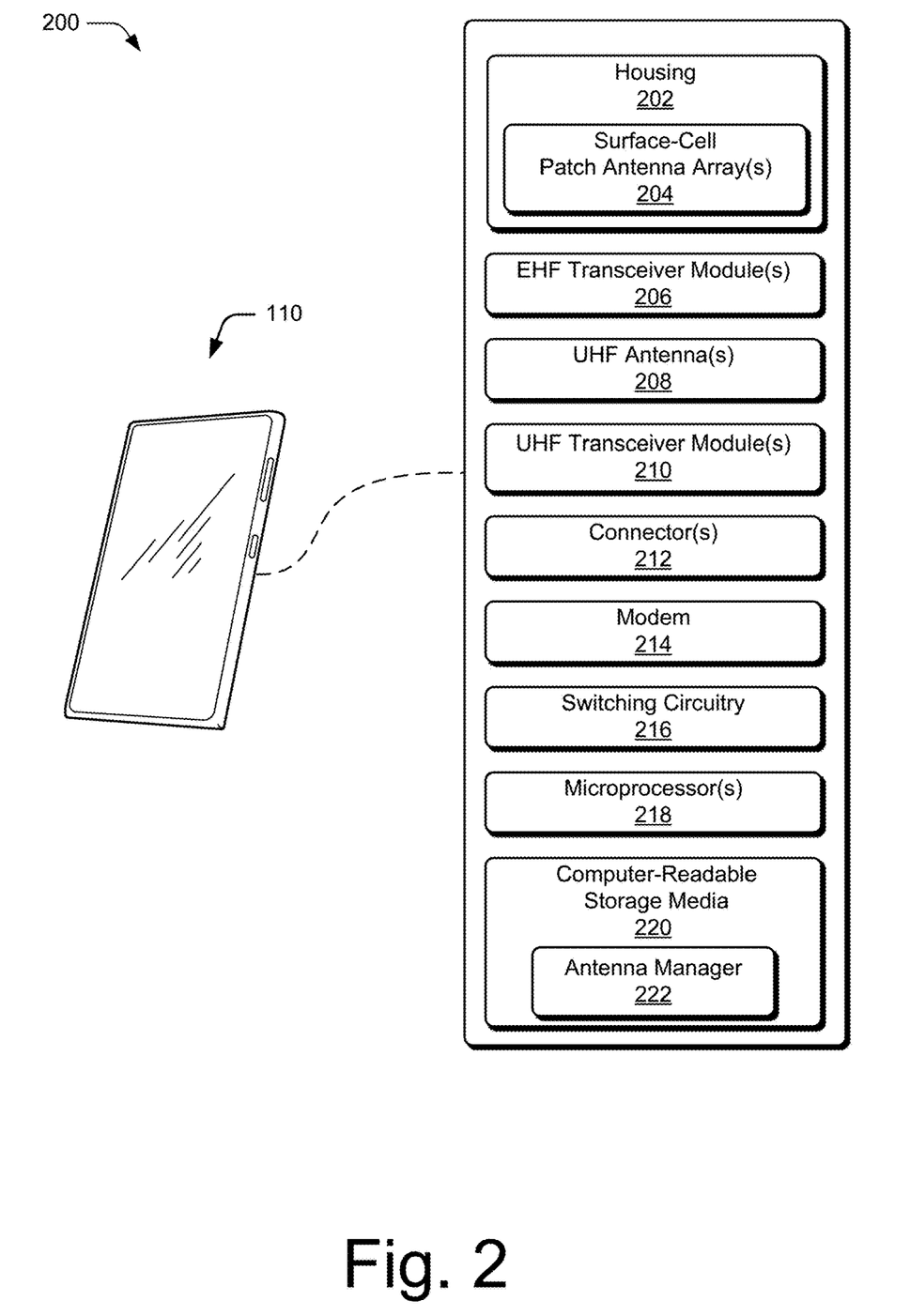
FIG. 2 illustrates an example device diagram for a user equipment that can implement various aspects of surface-cell patch antenna arrays in accordance with one or more aspects.

FIG. 2 illustrates an example device diagram 200 for a UE (e.g., the UE 110 of FIG. 1) that can implement various aspects of surface-cell patch antenna arrays in accordance with one or more aspects. The UE 110 may include additional functions and interfaces that are omitted from FIG. 2 for the sake of clarity.

The UE 110 includes a housing 202 that includes one or more surface-cell patch antenna arrays 204 each formed from a respective plurality of surface-cell patch antennas. The plurality of surface-cell patch antennas are formed from surface-cells of an electromagnetic-transparent metallic (ETM) surface of the housing 202. A corresponding extremely-high frequency (EHF) transceiver module 206, comprising a transceiver device and a printed circuit board, is disposed proximate each surface-cell patch antenna array 204 such that components of the UE 110 might independently control each surface-cell patch antenna array 204 and such that signal losses between each surface-cell patch antenna array 204 and each EHF transceiver module 206 are reduced due to short trace lengths.

Each surface-cell patch antenna array 204 can be tuned to, and/or be tunable to, one or more frequency bands defined by communication standards and implemented by each EHF transceiver module 206. As an example, each of the surface-cell patch antenna arrays 204 and EHF transceiver modules 206 may be tuned to frequency bands defined by 5G NR communication standards. Each surface-cell patch antenna array 204 and/or the EHF transceiver module 206 may also be configured to support beamforming for the transmission and reception of communications with a base station (e.g., the base station 120 of FIG. 1) or other mm-wave compatible device. Furthermore, each surface-cell patch antenna of the surface-cell patch antenna array 204 may transmit a vertical-polarization signal (e.g., an electromagnetic wave having an electric field vector that is perpendicular to the earth's surface) as well as a horizontal-polarization signal (e.g., an electromagnetic wave having an electric field vector that is parallel to the earth's surface).

The UE 110 also includes one or more Ultra-High frequency (UHF) antenna(s) 208 that may be disposed at various locations throughout the UE 110. One or more Ultra-High frequency UHF transceiver modules 210 are also included in the UE 110. Each UHF transceiver module 210 may be a module that generates or receives electromagnetic waves at frequencies ranging from, for example, 300 MHz to 3000 MHz, encompassing wireless communications associated with 3GPP LTE wireless communications standards and service providers.

In a fashion that is different than the structure described above (e.g., each surface-cell patch antenna array 204 having a corresponding EHF transceiver module 206), each UHF transceiver module 210 may be electrically coupled to more than one UHF antenna 208 and may further be located "away" from each UHF antenna 208 to which it is coupled. Each UHF antenna 208 can be tuned to, and/or be tunable to, one or more frequency bands defined by communication standards that are implemented by each UHF transceiver module 210. As an example, each of the UHF antennas 208 and UHF transceiver modules 210 may be tuned to frequency bands defined by 3GPP LTE communication standards. The UE 110 also includes connector(s) 212 that connect, respectively, each EHF transceiver module 206 and each UHF transceiver module 210 to one or more modem(s) 214.

Also included in the UE 110 is switching circuitry 216 that, in certain instances, may provide switching functions to switch from one of the surface-cell patch antenna arrays 204 to one or more of the UHF antenna(s) 208. For example, the UE 110 may be connected via the wireless link 131 to the 5G core network 150 of FIG. 1 (a 5G NR network operating at frequencies corresponding to mm-waves) and then connect via the wireless link 132 to the evolved packet core network 160 (a 3GPP LTE network operating within the UHF electromagnetic wave spectrum). In such an instance, the switching circuitry 216 may switch from the surface-cell patch antenna array 204 to the UHF antenna 208. In another example, the switching circuitry 216 may "relocate" transmission or reception regions associated with locations of either the surface-cell patch antenna array(s) 204 or UHF antenna(s) 208 based on signal interferences the UE 110 may be experiencing from a hand, body, walls, foliage, or other obstruction.

The switching circuitry 216 may also include double-pole double-throw (DPDT) circuits that switch amongst surface-cell patch antennas of each surface-cell patch antenna array 204 as well as the UHF antenna(s) 208. Switching may, in certain instances, alter transmission or reception patterns of the UE 110 and augment beamforming functions of the UE 110. In other instances, switching may "relocate" transmission or reception regions associated with locations of either a surface-cell patch antenna array 204 or a UHF antenna 208.

The UE 110 further includes one or more processor(s) 218 and computer-readable storage media 220 (CRM 220). Each processor 218 may be a single core processor or a multiple core processor composed of a variety of materials, such as silicon, polysilicon, high-K dielectric, copper, and so on. The computer-readable storage media described herein excludes propagating signals. CRM 220 may include any suitable memory or storage device such as random-access memory (RAM), static RAM (SRAM), dynamic RAM (DRAM), non-volatile RAM (NVRAM), read-only memory (ROM), or Flash memory.

CRM 220 stores executable instructions of an antenna manager application 222. Alternately or additionally, the antenna manager application 222 may be implemented in whole or part as hardware logic or circuitry integrated with or separate from other components of the UE 110. In at least some aspects, the antenna manager application 222 (e.g., the processor 218 executing the instructions of the antenna manager application 222) may configure each surface-cell patch antenna array 204, each EHF transceiver module 206, each UHF antenna 208, each UHF transceiver module 210, or the switching circuitry 216 in accordance with switching or beamforming operations performed by the UE 110.

Figure 3:
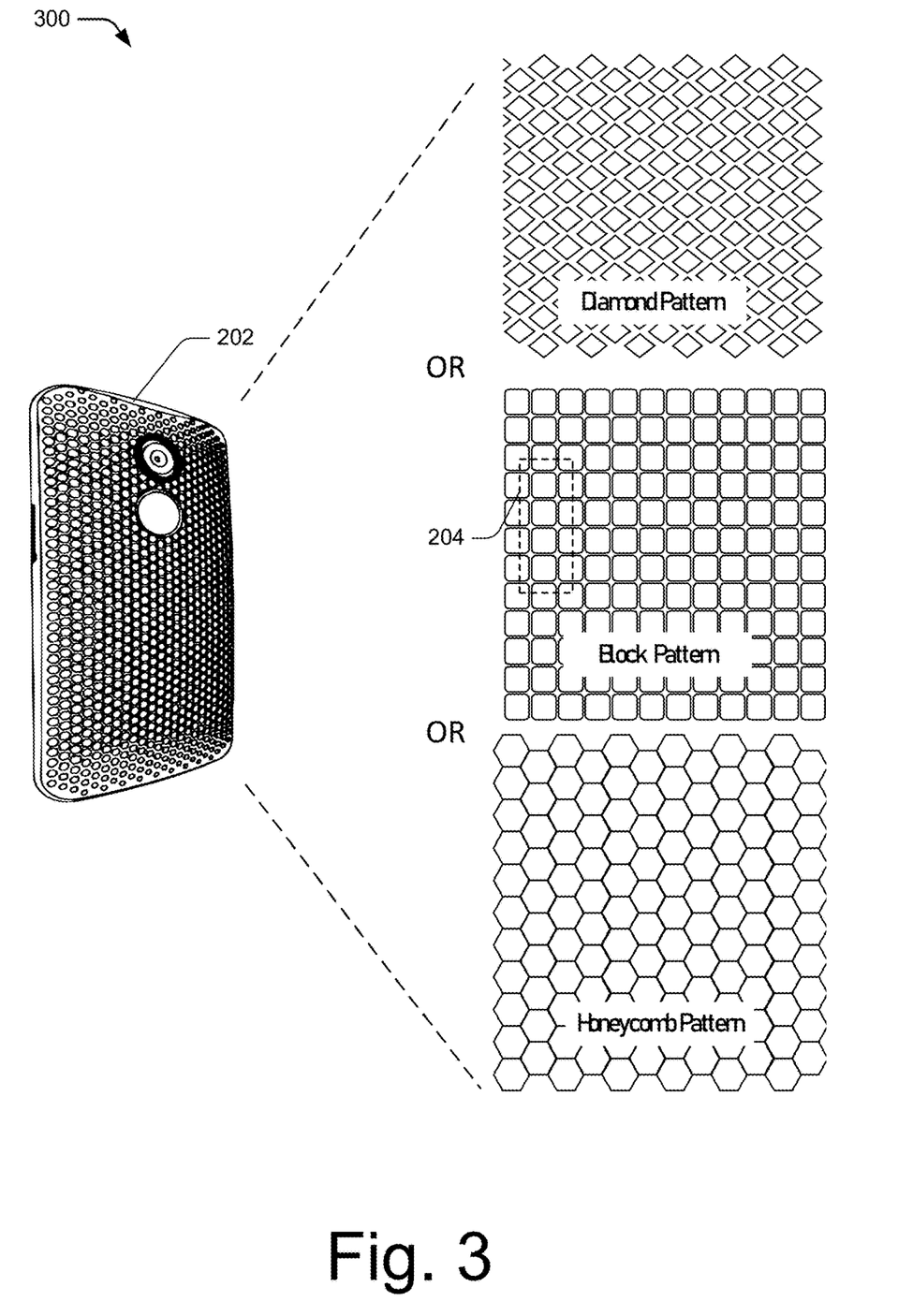
FIG. 3 illustrates example details of various mosaic patterns of surface-cells that may be used to form surface-cell patch antenna arrays in accordance with one or more aspects.

FIG. 3 illustrates example details 300 of various mosaic patterns of surface-cells that may be used to form surface-cell patch antenna arrays in accordance with one or more aspects. The surface-cells may comprise an ETM surface of the housing 202 of FIG. 2. The housing 202, as illustrated, is a housing of the UE 110 and illustrated from a perspective corresponding to a backside of the UE 110.

Details 300 illustrate several example mosaic patterns of surface-cells, including a diamond pattern comprised of multiple diamond-shapes surface-cells, a block pattern comprised of multiple block-shaped surface-cells, and a honeycomb pattern comprised of multiple hexagon-shaped surface-cells. The illustrated mosaic patterns of surface-cells are by way of example only, as many other mosaic patterns of surface-cells may be created using alternate surface-cell shapes (not illustrated).

A metal material that is suitable for transmission and reception of high-frequency electromagnetic waves (e.g., mm-waves associated with 5G NR wireless communications), such as aluminum, stainless steel, or copper, may form each surface cell of a mosaic pattern of surface-cells. From the mosaic pattern of surface-cells, a designer or manufacturer of the housing 202 may select a subset of surface-cells to form a surface-cell patch antenna array 204. In general, the surface-cell patch antenna array 204 is proximate an outer surface of the housing. Furthermore, an area of the surface-cell patch antenna array 204 may correspond to a first generally planar region proximate the outer surface of the housing (illustrated by the dashed line encompassing the four surface-cell patch antennas of the surface-cell patch antenna array 204). This first generally planar region, in some instances, may have a curvature associated with an outer surface of the housing 202.

As illustrated, each surface-cell is electrically isolated from an adjacent surface-cell by gaps comprised of a dielectric material. For example, the dielectric material might be a thermoplastic material or polycarbonate material or a non-metallic substrate. The gaps comprising the dielectric material might allow propagation of other electromagnetic waves, and be "transparent" to the other electromagnetic waves. The other electromagnetic waves might have wavelengths that are greater than 10 mm in length and be associated with 3GPP LTE wireless communications, inductive charging of the UE 110, or the like.

Figure 4:
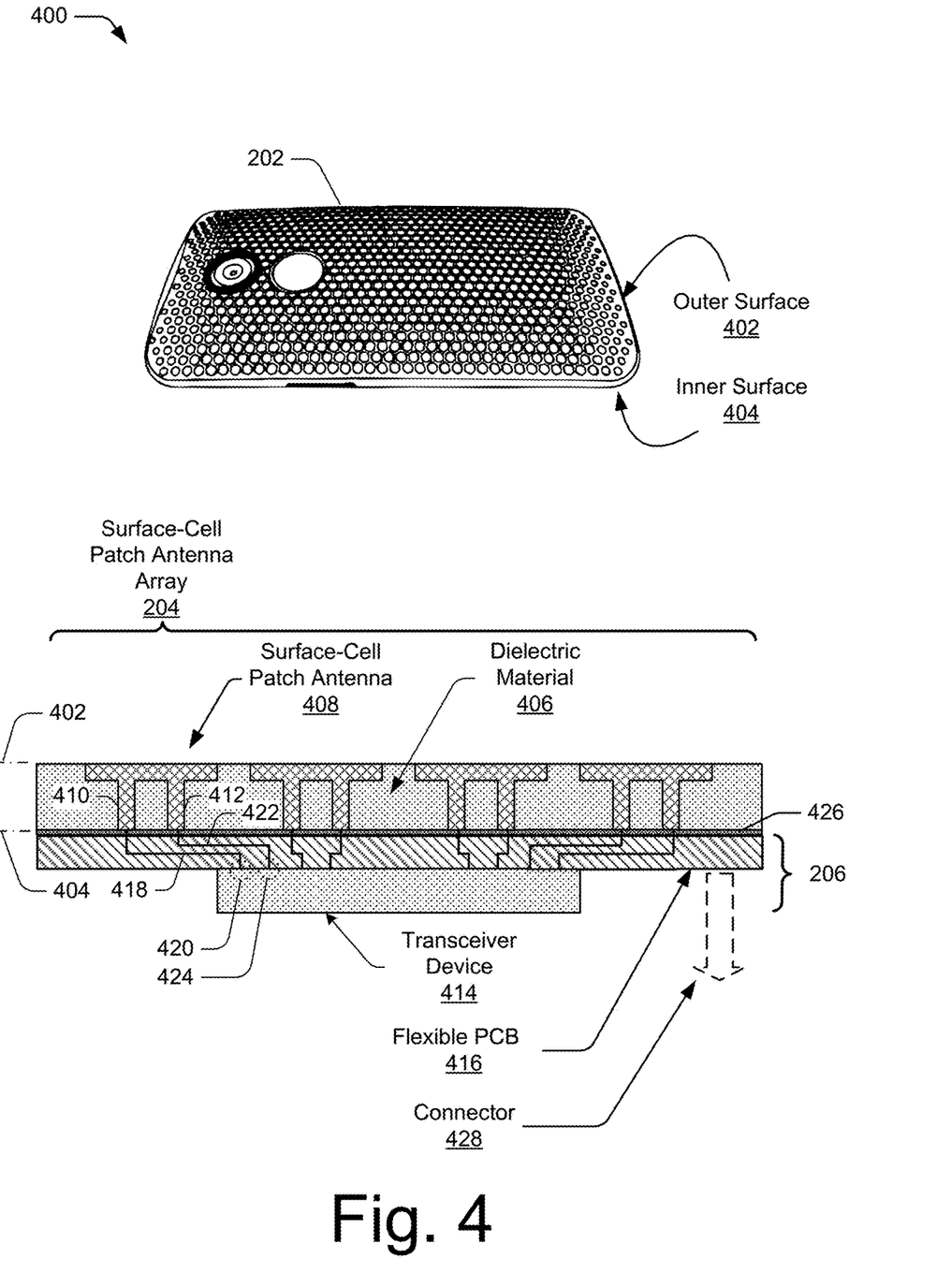
FIG. 4 illustrates example details of a surface-cell patch antenna array in accordance with one or more aspects.

FIG. 4 illustrates example details 400 of a surface-cell patch antenna array in accordance with one or more aspects. The surface-cell patch antenna array may be the surface-cell patch antenna array 204 of FIG. 2 as formed into the housing 202 of FIG. 2.

As illustrated, the housing 202 includes an outer surface 402 and an inner surface 404. The inner surface 404 is opposite the outer surface 402 and is separated by a thickness of a dielectric material 406 that forms a substrate of the housing 202. The inner surface 404 and the outer surface 402 are, in general, parallel to each other and may in some instances have a curvature.

A surface-cell patch antenna 408 is disposed proximate the outer surface 402 of the housing 202. The surface-cell patch antenna 408 includes a vertical-polarization signal feed post 410 and a horizontal-polarization signal feed post 412. The vertical-polarization signal feed post 410 and the horizontal-polarization signal feed post pass through the dielectric material 406 to the inner surface 404 of the housing 202.

Multiples of the surface-cell patch antenna 408 form the surface-cell patch antenna array 204, where an area of the surface-cell patch antenna array 204 defines a first generally planar region proximate the outer surface 402 of the housing 202. As illustrated in FIG. 4, the surface-cell patch antenna array 204 is exposed to an environment surrounding the user equipment. Alternatively, the surface-cell patch antenna array 204 may be coated with a protective material (not illustrated) through which an electromagnetic wave can pass.

A transceiver module (e.g., the extremely high frequency (EHF) transceiver module 206), including a transceiver device 414 and a flexible printed circuit board (PCB) 416, is disposed proximate the inner surface 404 of the housing 202. The flexible PCB 416 includes a trace 418 that electrically couples the vertical-polarization signal feed post 410 to a vertical-polarization signal output 420 of the transceiver device 414. The flexible PCB 416 also includes a trace 422 that electrically couples the horizontal-polarization signal feed post 412 to a horizontal-polarization signal output 424 of the transceiver device 414.

The EHF transceiver module 206, including the transceiver device 414 and the flexible PCB 416, is disposed in a second generally planar region that is parallel to, and corresponds with, the first generally planar region that is defined by the surface-cell patch antenna array 204. Additional elements of the EHF transceiver module 206 that are not illustrated may include resistors, switches, capacitors, filters, or the like. Furthermore, the EHF transceiver module 206 may be affixed to the dielectric material 406 with the assistance of an adhesive material 426 disposed between the flexible PCB 416 and the dielectric material 406. As an example, the adhesive material 426 might be an epoxy underfill material.

In one example instance, and as illustrated, the transceiver device 414 may be an un-encapsulated integrated-circuit (IC) die, in which instance the vertical-polarization signal output 420 and the horizontal-polarization signal output 424 are pads that may be used for flip chip interconnects, stud bump interconnects, wire bonding interconnects, or the like. In another example and alternate instance (not illustrated), the transceiver device 414 may be a package component (e.g., the IC die is encapsulated as a package component) in which instance the vertical-polarization signal output 420 and the horizontal-polarization signal output 424 are lead terminals of a package component such as a ball grid array (BGA) package component, a quad-flat-pack (QFP) package component, a thin small outline (TSOP) package component, or the like. In either instance, the vertical-polarization signal output 420 and the horizontal-polarization signal output 424 may be electrically coupled to corresponding circuitry of the IC die. Furthermore, and in certain instances, the transceiver device 414 may transmit and receive mm-wave signals (e.g., signals within an electromagnetic spectrum associated with 5G NR wireless communication standards).

In some instances, the dielectric material 406 may be a dielectric material such as a thermoplastic or polycarbonate material while the surface-cell patch antenna 408 may be a metal material such as aluminum, stainless steel, or copper. The flexible PCB 416 may include a glass-reinforced epoxy laminate material such as FR4. As part of the flexible PCB 416, the trace 418 and the trace 422 may be formed from a conductive material such as copper, aluminum, or the like. Additionally, the flexible PCB 416 may be comprised of multiple layers and include traces other than the trace 418 and the trace 422.

A connector 428, in the form of a flex-cable or other mechanism capable of conducting multiple signals, may connect the flexible PCB 416 to another device of the UE 110, such as a modem. Additional traces and interconnect mechanisms (not illustrated) may be required to electrically couple the connector 428, via the flexible PCB 416, to the transceiver device 414. Such additional traces and interconnect mechanisms would be dependent on a pinout of the transceiver device 414, where the pinout would identify interconnect locations for electrical signals that might be associated with data input or output, power, ground, enablement, disablement, or other functions used for operating the transceiver device 414. The transceiver device 414 may down-convert the EHF to Intermediate Frequencies (IF) to reduce the insertion loss in the flexible cable at EHF.

Figure 5:
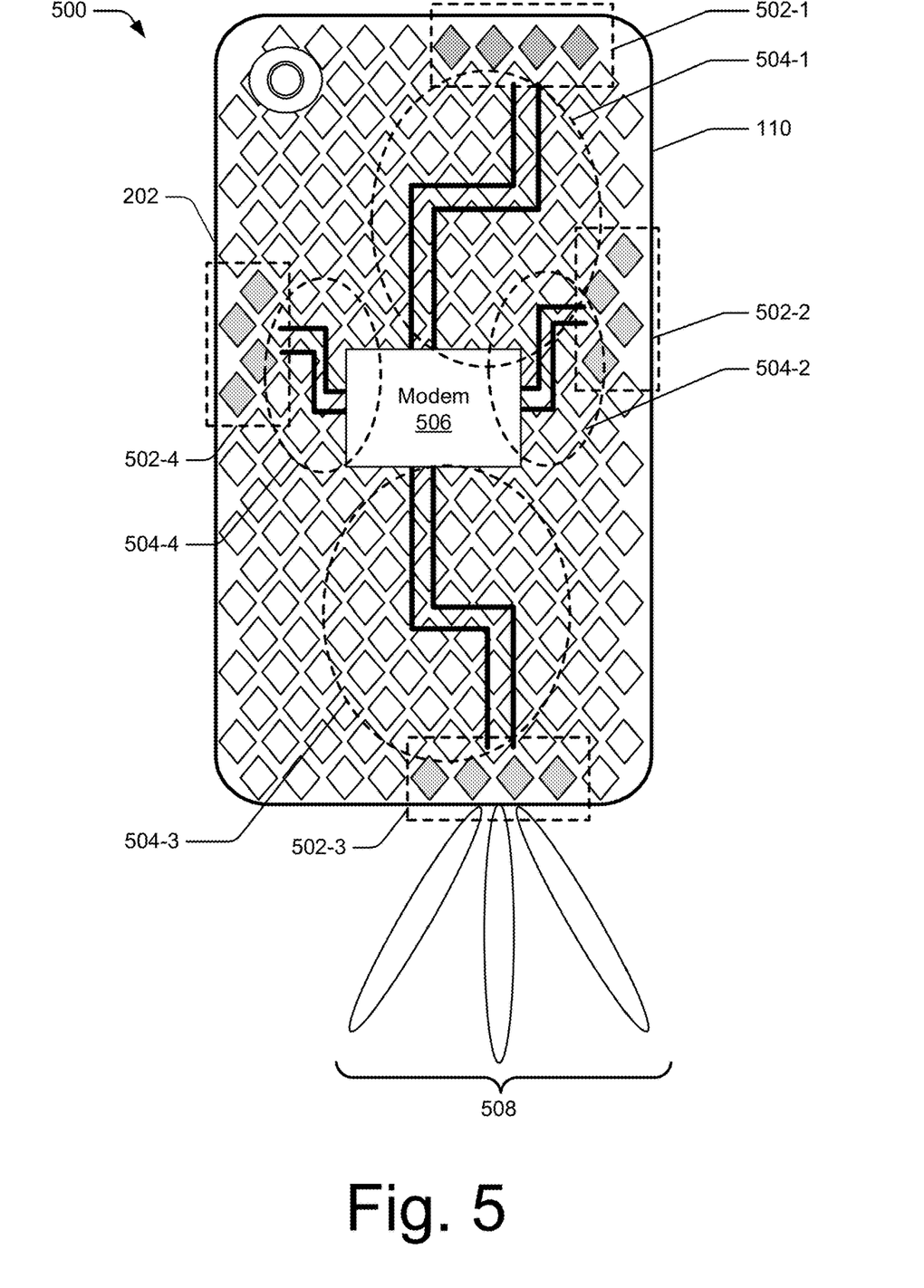
FIG. 5 illustrates example details of multiple surface-cell patch antenna arrays in accordance with one or more aspects.

FIG. 5 illustrates example details 500 of multiple surface-cell patch antenna arrays in accordance with one or more aspects. Each of the multiple surface-cell patch antenna arrays may correspond to the surface-cell patch antenna array 204 of FIG. 2 and include aspects of FIG. 3 as well as FIG. 4.

As illustrated in FIG. 5, multiple surface-cell patch antenna arrays 502-1 through 502-4 are formed from a groups of surface-cell patch antennas. The groups of surface-cell patch antennas, in turn, are formed from subsets of surface-cells comprising an ETM surface of the UE 110. As illustrated, each of the multiple surface-cell patch antenna arrays 502-1 through 502-4 are formed from a respective subset of four "diamonds" selected from a pattern of diamond surface-cells comprising the ETM surface of the UE 110. Each surface-cell patch antenna array 502-1 through 502-4 may correspond to the surface-cell patch antenna array 204 of FIG. 2. Furthermore, each diamond of each surface-cell patch antenna array 502-1 through 502-4 may correspond to the surface-cell patch antenna 408 (including the vertical-polarization signal feed post 410 and the horizontal-polarization signal feed post 412).

A transceiver module (not illustrated) is disposed underneath each surface-cell patch antenna array. Each transceiver module may correspond to the EHF transceiver module 206 of FIG. 2. Furthermore, each transceiver module may include the transceiver device 414 and the flexible printed circuit board 416 of FIG. 4, having the traces 418 and 422 that couple feed posts of the surface-cell patch antenna array (e.g., feed posts corresponding to the vertical-polarization signal feed post 410 and the horizontal-polarization signal feed post 412) to the transceiver device 414.

A modem 506, which may be used for modulating or demodulating signals associated with wireless communications to and from the UE 110, may be contained on a logic board of the UE 110. Furthermore, the modem 506 is coupled to each transceiver module via respective connectors 504-1 through 504-4. Each connector 504-1 through 504-4 may be, for example, a flex cable that includes dedicated down-converted vertical-polarization IF signal and horizontal-polarization IF signal conductors for each surface-cell patch antenna (of a respective surface-cell patch antenna array) that is managed by the respective transceiver module.

Each of the multiple surface-cell patch antenna arrays 502-1 may perform, either independently or in unison, beamforming operations 508 as part of wireless communications to and from the UE 110. The example configuration provides the UE 110 with diverse electromagnetic mm-wave wireless communication capabilities, including multi-channel multiple-input/multiple-output (MIMO) capabilities, carrier aggregation capabilities, and the like.

Example Methods

Figure 6:
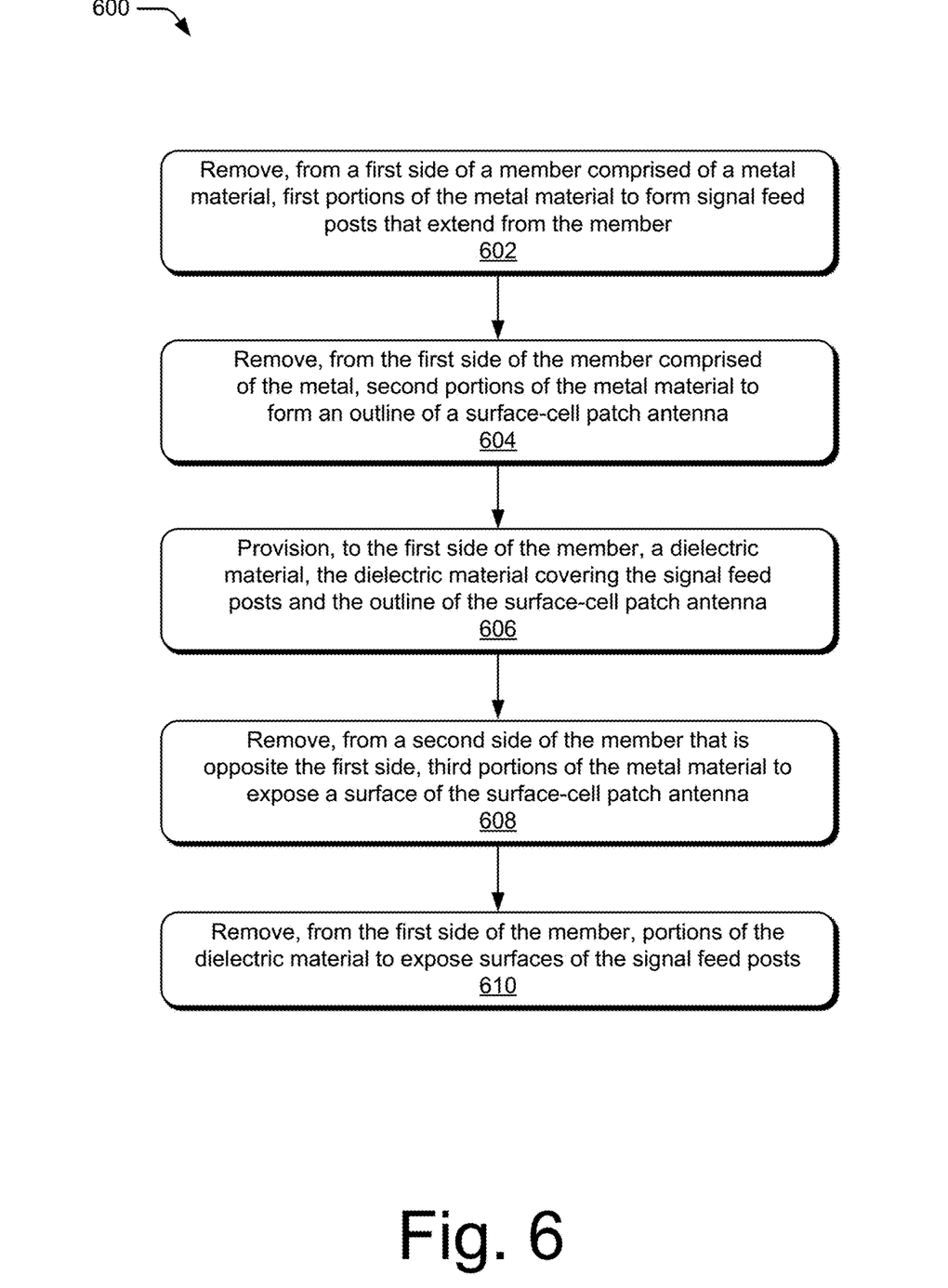
FIG. 6 illustrates an example method for fabricating a surface-cell patch antenna in accordance with one or more aspects.
Figure 7A:
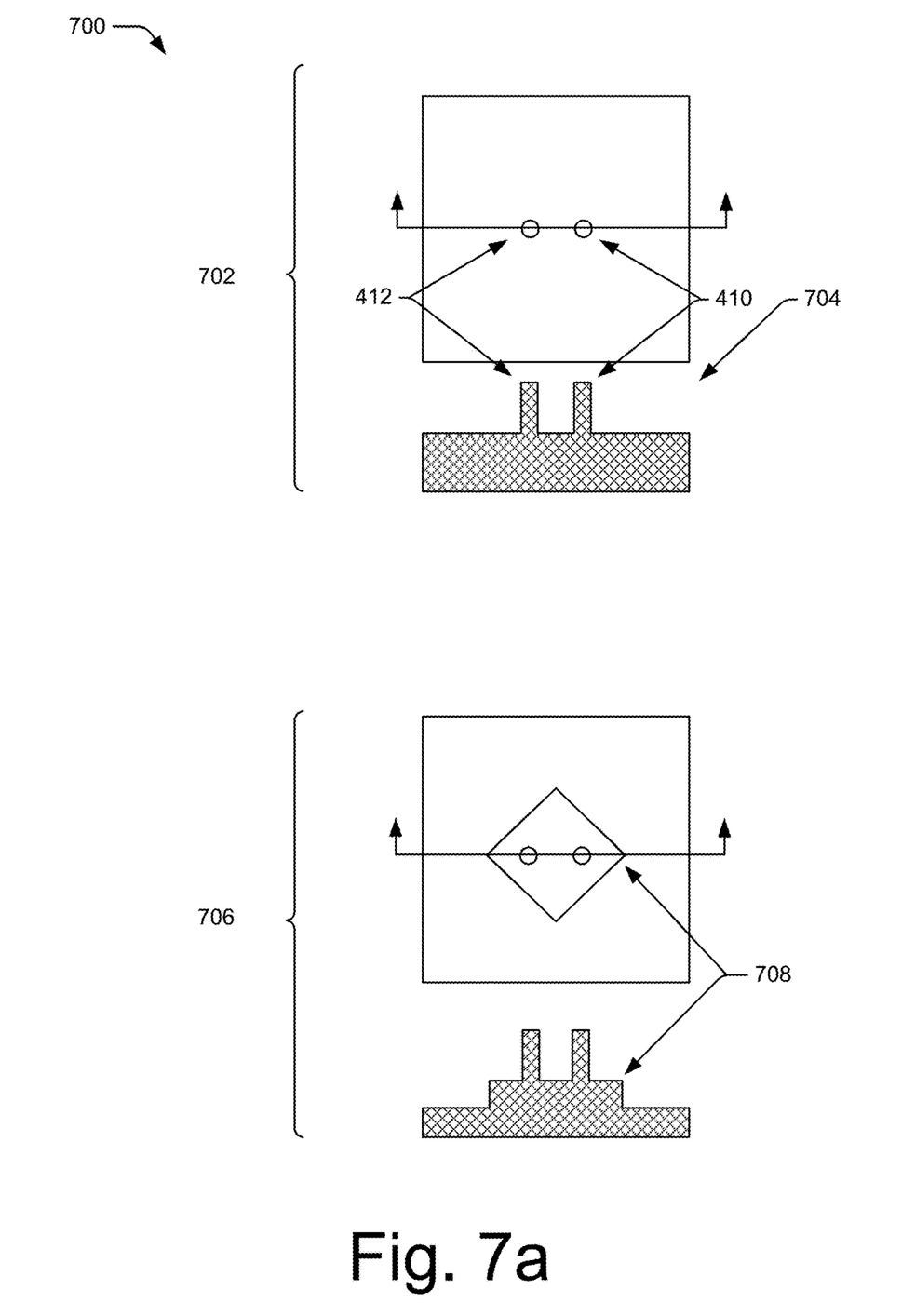
FIGS. 7a-7c illustrate details of fabricating a surface-cell patch antenna in accordance with one or more aspects.
Figure 7B:
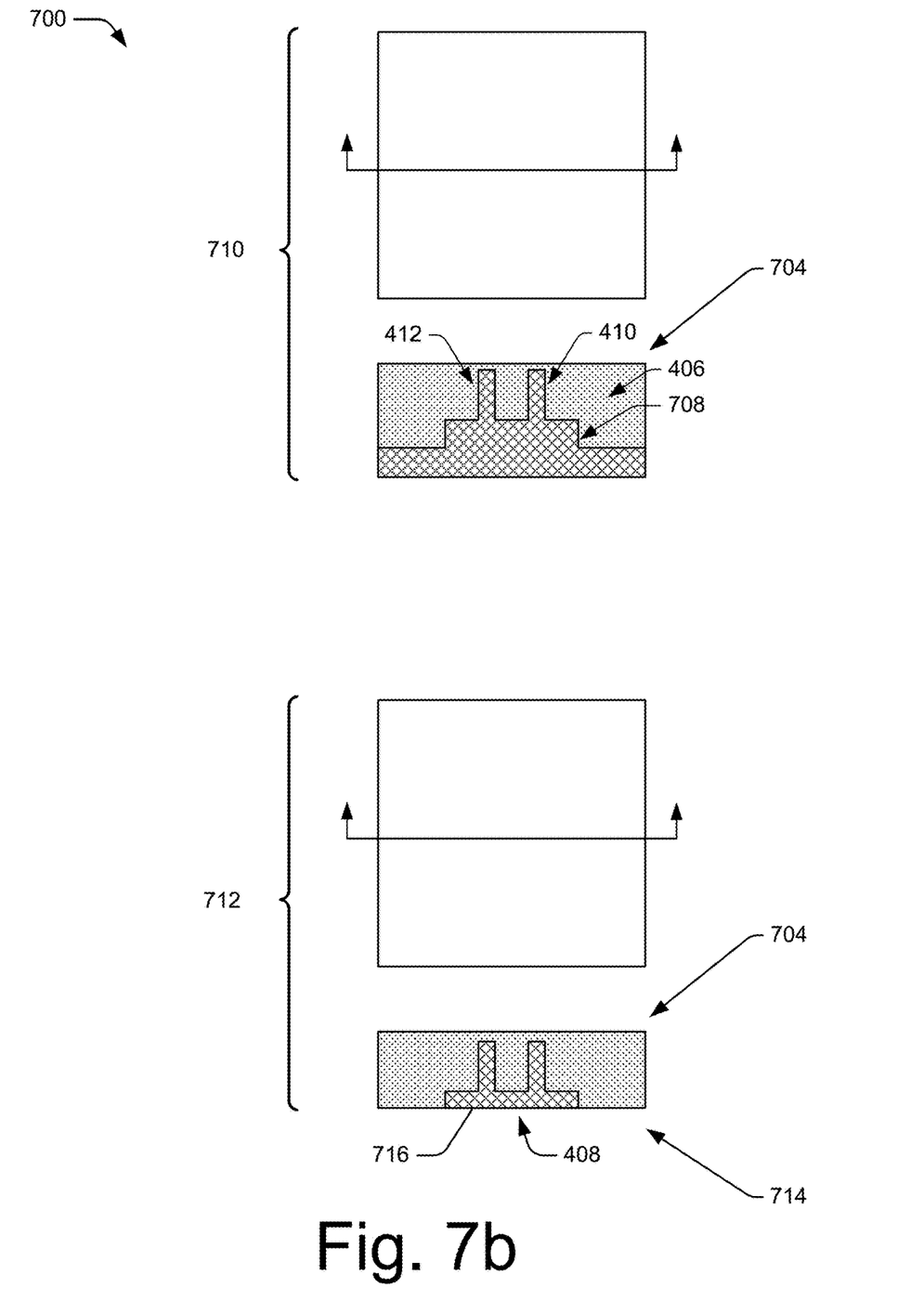
Figure 7C:
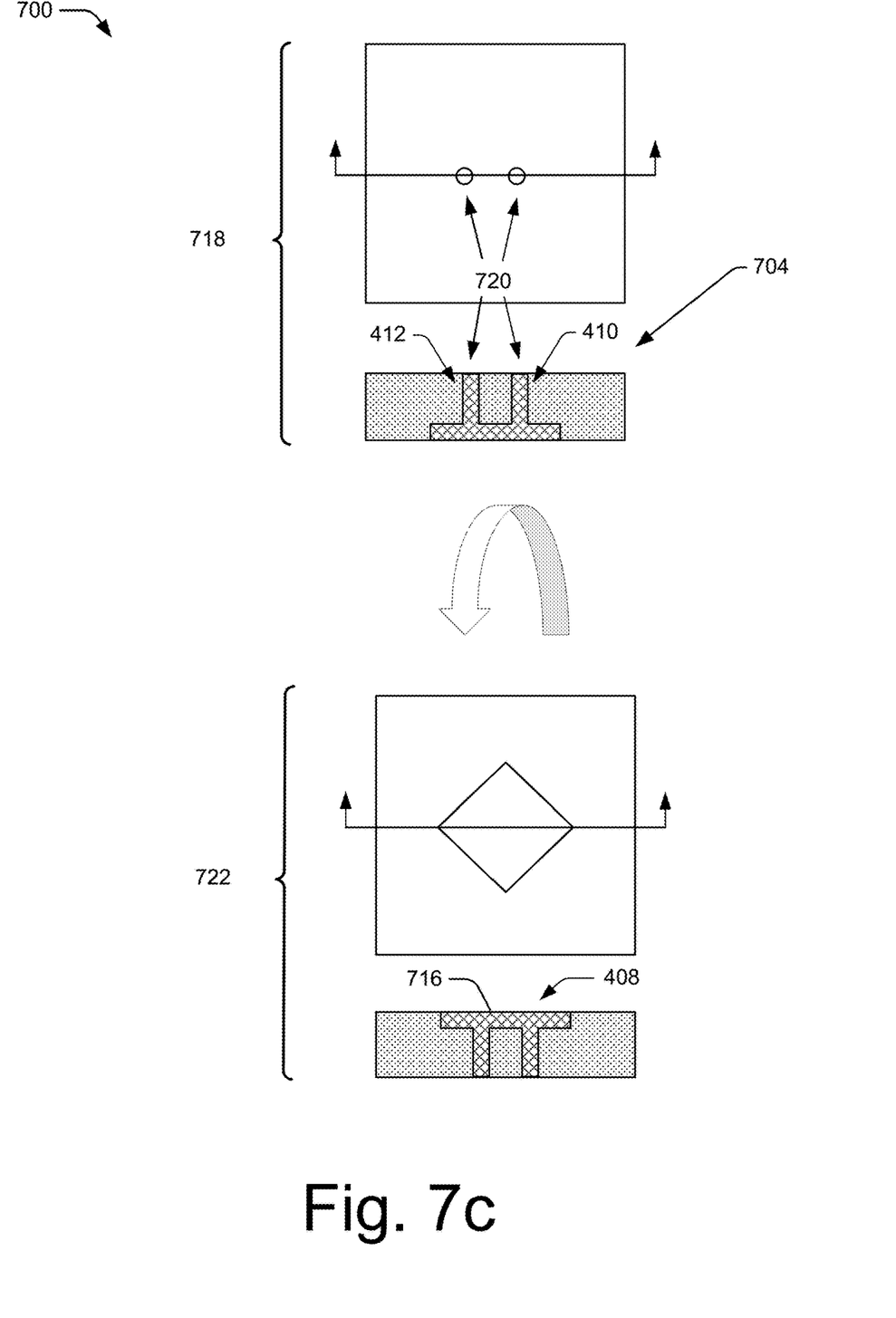

FIG. 6 illustrates an example method 600 for fabricating a surface-cell patch antenna in accordance with one or more aspects. The surface-cell patch antenna may be the surface-cell patch antenna 408, including the vertical-polarization signal feed post 410, and the horizontal-polarization signal feed post 412 of FIG. 4 and be used as part of the surface-cell patch antenna array 204 of FIG. 2. Complementary to the method 600, FIGS. 7a-7c illustrate details 700 of fabricating the surface-cell patch antenna as part of the electromagnetic-transparent metallic surface in accordance with one or more aspects.

At 602, manufacturing operations remove, from a first side of a member comprised of a metal material, first portions of the metal material to form signal feed posts that extend from the member. As examples, the metal material comprising the member may be aluminum, stainless steel, or copper. In certain instances, the manufacturing operations at 602 may include one or more techniques that incorporate a computer numerical control (CNC) machining process, an electrical discharge machining (EDM) process, a lithography/etching process, an engraving process, or the like.

As illustrated by the top view and the section view at 702, first portions of material have been removed from a first side 704 of a member comprised of a metal material to form signal feed posts (e.g., the vertical-polarization signal feed post 410 and the horizontal-polarization signal feed post 412).

At 604, manufacturing operations remove, from the first side of the member, second portions of the metal material to form an outline of a surface-cell patch antenna The manufacturing operations at 604 may be the same as or different from the manufacturing operations at 602.

As illustrated by the top view and the section view at 706, the outline 708 of a surface-cell patch antenna has been formed by the removal of second portions of metal material. In this instance, the removal of the second portions of metal material removes the second portions of the metal material to a "depth" of the metal member that is greater than the depth of the removed first portions of the metal material.

At 606, manufacturing operations provision, to the first side of the member, a dielectric material. Provision of the dielectric material is such that the dielectric material covers the signal posts and the outline of the surface-cell patch antenna. As examples, the dielectric material may be a thermoplastic or polycarbonate material. In certain instances, the manufacturing operations may include one or more techniques that incorporate an injection molding process, a thermo-compression process, a laminating process, a dispense process, a three-dimensional (3D) printing process, or the like.

Continuing with the example and as illustrated at 710, a dielectric material (e.g., the dielectric material 406 of FIG. 4) is provisioned to the first side 704 of the member such that the dielectric material 406 covers the vertical-polarization signal feed post 410, the horizontal-polarization signal feed post 412, and the outline 708 of the surface-cell patch antenna.

At 608, manufacturing operations remove, from a second side of the member that is opposite the first side, third portions of the metal material to expose the surface-cell patch antenna. In certain instances, the manufacturing operations at 608 may include one or more techniques that incorporate a grinding process, an electrochemical polishing process, an etching process, or the like.

Continuing with the example and as illustrated at 712, third portions of the metal material have been removed from a second side 714 of the member that is opposite the first side 704. Furthermore, the third portions of the metal material are removed such that a surface 716 of the surface-cell patch antenna (e.g., a surface of the surface-cell patch antenna 408 of FIG. 4) is exposed.

At 610, manufacturing operations remove, from the first side of the member, portions of the dielectric material to expose surfaces of the signal feed posts. In certain instances, the manufacturing operations at 610 may include one or more techniques that incorporate a grinding process, an electrochemical polishing process, an etching process, or the like.

As illustrated by the ongoing example at 718, portions of the dielectric material 406 have been removed to expose surfaces 720 of the signal feed posts (e.g., the vertical-polarization signal feed post 410 and the horizontal-polarization signal feed post 412). As illustrated at 722, the member has been inverted to illustrate the surface 716 of the surface-cell patch antenna 408 and to further correspond to orientation of the surface-cell patch antenna 408 as depicted in FIG. 4.

Figure 8:
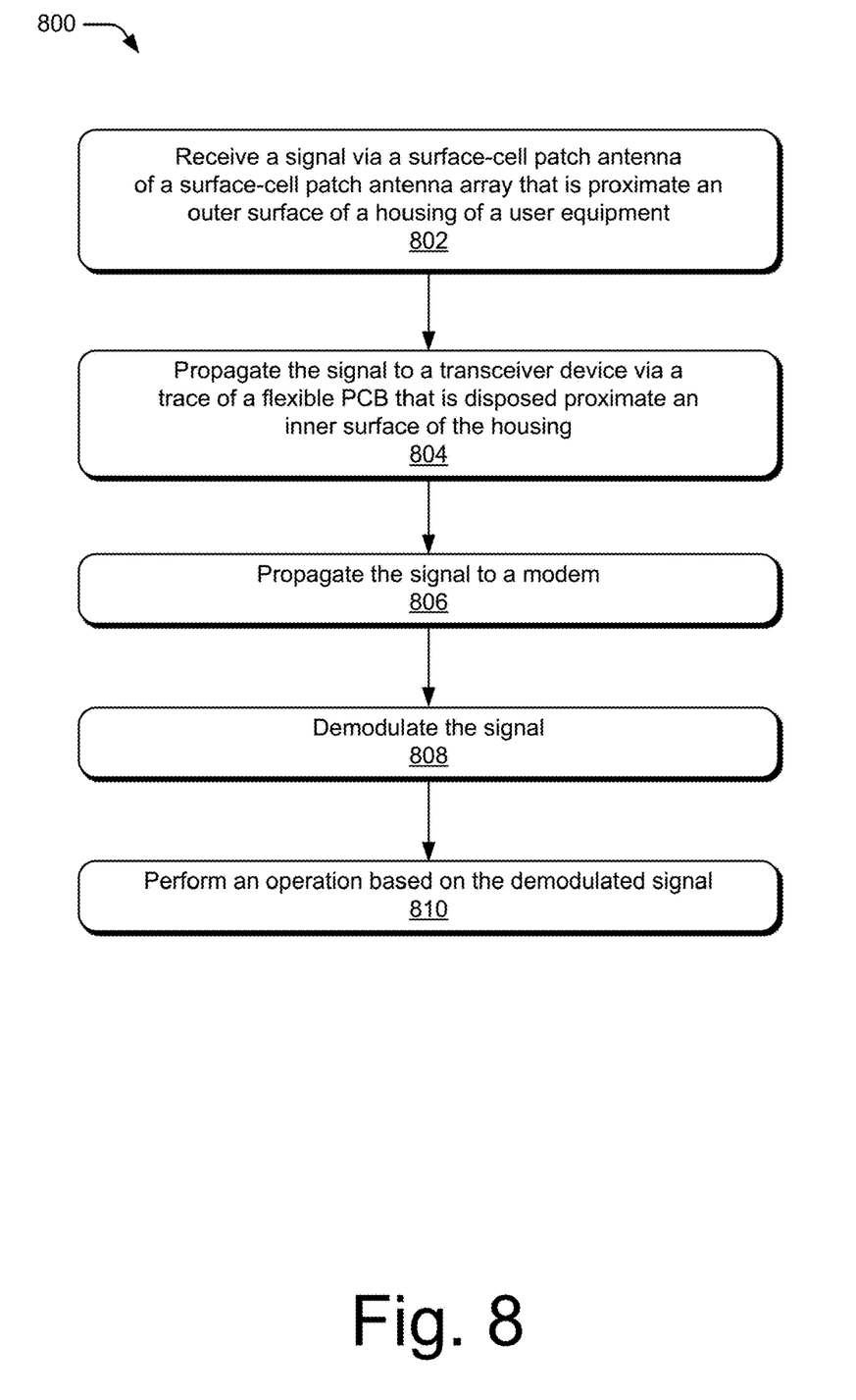
FIG. 8 illustrates an example method performed by a user equipment in accordance with one or more aspects.

FIG. 8 illustrates an example method 800 performed by a user equipment in accordance with one or more aspects. The user equipment may be the UE 110 of FIG. 1, and incorporate elements of FIGS. 2-5.

At 802, the UE 110 receives a signal via the surface-cell patch antenna 408 of the surface-cell patch antenna array 204 that is proximate the outer surface 402 of a housing 202 of the UE 110. The surface-cell patch antenna 408 is formed from surface-cells of an electromagnetic-transparent metallic surface of the housing 202. The signal may be in the form of an electromagnetic mm-wave that is transmitted by a base station or another device capable of transmitting the electromagnetic mm-wave in compliance with fifth-generation new radio (5G NR) wireless communication standards. Examples of other devices include a smart-appliance, another UE, a satellite-communication system, a computer-assisted driving system, and the like. Examples of signal content include a signal comprising an instruction or command for the UE 110 to execute or a signal comprising video content for streaming.

As another example, the signal may be in the form of an electromagnetic wave that has a wavelength that is less than 1 mm in length and is associated with sixth-generation (6G) wireless-communication protocols.

At 804, the UE 110 propagates the signal to the transceiver device 414 via a trace (e.g., the trace 418 or the trace 422) of the flexible printed circuit board 416 that is disposed proximate to the inner surface 404 of the housing 202.

At 806, the UE 110 propagates the signal to the modem 506 that is part of the UE 110. The signal is propagated via the connector 428 that electrically couples the flexible PCB 416 to the modem 506.

At 808, the UE 110 demodulates the signal via the modem 506. At 810 the UE 110 performs an operation, where the operation is performed via a processor based on the demodulated signal (e.g., the processor 218 of the UE 110 performs an operation based on the demodulated signal).

The example method 800 may include or more additional operations performed by the UE 110. Additional operations may include, for example, filtering the signal (via a bandpass filter device of the UE 110), down-converting the signal to a frequency that corresponds to a different wavelength (via the transceiver device 414), amplifying the signal (via an amplifier device of the UE 110), or the like.

Variations

The aforementioned configuration of the UE 110 has multiple variations. As a first example variation, in some instances the transceiver device 414 may be an un-encapsulated integrated-circuit (IC) die that includes a redistribution layer (RDL) on a surface of the IC die. In this first example variation, the RDL of the IC die may perform as substitutes for the traces 418 and 422 that couple feed posts of the surface-cell patch antenna array (e.g., feed posts corresponding to the vertical-polarization signal feed post 410 and the horizontal-polarization signal feed post 412). Electrical interconnections that include flip chip bumping (interfacing the IC die to the surface-cell patch antenna array 204) or wire bonding (interfacing the IC die to the connector 428) may obviate the need for a flexible printed circuit board (e.g., the flexible PCB 416).

In a second example variation, each surface-cell of a mosaic pattern of surface-cells comprising an electromagnetic-transparent metallic (ETM) surface of the housing 202 may be configured to perform as a surface-cell patch antenna. Such a second example variation may render the entire ETM surface to be configurable as a number of surface-cell patch antenna arrays.

It must be noted that although the surface-cell patch antenna array 204 structure has been described in the context of 5G NR wireless communications, the surface-cell patch antenna array 204 structure can be used to support wireless communications having frequencies that exceed those of 5G NR. Such wireless communications (e.g., sixth-generation or 6G wireless communications) may, for example, require antenna structures that support frequencies in excess of 300 GHz.

Although aspects of surface-cell patch antenna arrays formed into an electromagnetic-transparent metallic surface have described in language specific to features and/or methods, the subject of the appended claims is not necessarily limited to the specific features or methods described. Rather, the specific features and methods are disclosed as example implementations of such antenna arrays, and other equivalent features and methods are intended to be within the scope of the appended claims. Further, various different aspects are described, and it is to be appreciated that each described aspect can be implemented independently or in connection with one or more other described aspects.

What is claimed is:

1. A user equipment comprising:
   a housing having an outer surface and an inner surface, the outer surface parallel to the inner surface and separated from the inner surface by a dielectric material, the dielectric material of a thickness and forming a substrate of the housing;
   a surface-cell patch antenna array formed into the substrate of the housing, each surface-cell patch antenna of the surface-cell patch antenna array including:
     an exposed surface along a first generally planar region proximate the outer surface;
     a vertical-polarization signal feed post that passes through the substrate to the inner surface; and
     a horizontal-polarization signal feed post that passes through the substrate to the inner surface;
   a transceiver module disposed in a second generally planar region that is parallel to the first generally planar region and that is located proximate the inner surface of the housing, the transceiver module comprising:
     a transceiver device, the transceiver device capable of transmitting and receiving millimeter (mm)-wave signals; and
     a flexible printed circuit board having traces that electrically couple the transceiver device to the surface-cell patch antenna array; and
   a connector, the connector electrically coupling the transceiver module to a modem contained on a logic board of the user equipment.

2. The user equipment as recited in claim 1, wherein the surface-cell patch antenna array comprises a plurality of surface-cell patch antennas, each surface-cell patch antenna formed from surface-cells an electromagnetic-transparent metallic surface of the housing.

3. The user equipment as recited in claim 2, wherein the surface-cells are formed from aluminum, stainless steel, or copper.

4. The user equipment as recited in claim 2, wherein the surface-cell patch antenna array is exposed to an environment surrounding the user equipment at the outer surface.

5. The user equipment as recited in claim 2, wherein the surface-cell patch antenna array is coated with a protective material through which electromagnetic waves can pass.

6. The user equipment as recited in claim 1, wherein the mm-wave signals conform to fifth-generation new radio (5G NR) wireless communication standards.

7. The user equipment as recited in claim 6, wherein the transceiver device is an un-encapsulated integrated-circuit (IC) die.

8. The user equipment as recited in claim 6, wherein the transceiver device is a ball grid array (BGA) package component, a quad-flat-pack (QFP) package component, or a thin small outline (TSOP) package component.

9. A structure comprising:
a surface-cell patch antenna having a surface that is exposed along a generally planar region proximate to an outer surface of a housing, the housing having a substrate formed from a dielectric material of a thickness, and the surface-cell patch antenna formed into the housing;
a vertical-polarization signal feed post, the vertical-polarization signal feed post electrically coupled to the surface-cell patch antenna and passing through the dielectric material to an inner surface of the housing, the inner surface of the housing opposite the outer surface of the housing and generally parallel to the outer surface of the housing;
a horizontal-polarization signal feed post, the horizontal-polarization signal feed post electrically coupled to the surface-cell patch antenna and passing through the dielectric material to the inner surface of the housing;
a transceiver module, the transceiver module electrically coupled to a modem by a connector and comprising:
a transceiver device, the transceiver device capable of transmitting and receiving millimeter (mm)-wave signals; and
a flexible printed circuit board that is affixed to the inner surface of the housing, the flexible printed circuit board including:
a trace that electrically couples the vertical-polarization signal feed post to a vertical-polarization signal output of the transceiver device, the vertical-polarization signal output including a pad for a flip chip interconnect, a stub bump interconnect, a wire bonding interconnect, or a lead terminal of a package component; and
another trace that electrically couples the horizontal-polarization signal feed post to a horizontal-polarization signal output of the transceiver device, the horizontal-polarization signal output including a pad for a flip chip interconnect, a stub bump interconnect, a wire bonding interconnect, or a lead terminal of a package component.

10. The structure as recited in claim 9, wherein the transceiver device transmits and receives the mm-wave signals in accordance with fifth-generation new radio (5G NR) wireless communication standards.

11. The structure as recited in claim 10, wherein the vertical-polarization signal output and a horizontal-polarization signal output of the transceiver device are pads for flip chip interconnects, stud bump interconnects, wire bonding interconnects, or lead terminals of a package component.

12. The structure as recited in claim 9, wherein the dielectric material is a thermoplastic material or polycarbonate material.

13. The structure as recited in claim 9, further comprising an epoxy underfill material disposed between the flexible printed circuit board and the inner surface.

14. A method performed by a user equipment, the method comprising:
receiving a millimeter (mm)-wave signal through a surface-cell patch antenna, the surface-cell patch antenna formed into a housing of the user equipment and exposed along an outer surface of the housing of the user equipment;
propagating the mm-wave signal to a transceiver device via a horizontal-polarization signal feed post and a vertical-polarization signal feed post that passes through the housing and electrically couples to a trace of a flexible printed circuit board (PCB), the PCB disposed proximate an inner surface of the housing that is opposite the outer surface and generally parallel to the outer surface;
propagating the mm-wave signal to a modem that is part of the user equipment, the signal propagated via a connector that electrically couples the flexible PCB to the modem;
demodulating the mm-wave signal via the modem; and
performing an operation, the operation performed by a processor of the user equipment based on the demodulated signal.

15. The method as recited by claim 14, further comprising down-converting the mm-wave signal via the transceiver device.

16. The method as recited by claim 14, further comprising a filter device of the user equipment filtering the mm-wave signal or an amplifier device of the user equipment amplifying the mm-wave signal.

17. The method as recited by claim 14, wherein the mm-wave signal with fifth-generation new radio (5G NR) wireless communication standards.

18. The method as recited by claim 17, wherein the signal is received from a smart appliance, a satellite-communication system, or a computer-assisted driving system.

19. The method as recited by claim 17, wherein the signal is a signal that streams media content.

20. The method as recited by claim 14, wherein the signal is an electromagnetic wave that has a wavelength that is less than 1 mm in length.

21. The user equipment as recited in claim 1, wherein the outer surface of the housing and the inner surface of the housing have curvature.

* * * * *